(12) United States Patent
Shirazi et al.

(10) Patent No.: US 9,183,339 B1
(45) Date of Patent: Nov. 10, 2015

(54) SYSTEM AND METHOD FOR PREPARING PARTIALLY RECONFIGURABLE CIRCUIT DESIGNS

(71) Applicant: Xilinx, Inc., San Jose, CA (US)

(72) Inventors: Nabeel Shirazi, Millbrae, CA (US); David Robinson, Loanhead (GB); Amit Kasat, Hyderabad (IN); Arvind Sundararajan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/538,595

(22) Filed: Nov. 11, 2014

(51) Int. Cl.
*G06F 17/50* (2006.01)

(52) U.S. Cl.
CPC .................................... *G06F 17/505* (2013.01)

(58) Field of Classification Search
CPC ............ G06F 17/5054; G06F 15/7867; G06F 15/8015; G06F 17/5027; G06F 17/5045; G06F 17/505; G06F 7/38; H03K 19/17756
See application file for complete search history.

(56) References Cited

U.S. PATENT DOCUMENTS

| | | | |
|---|---|---|---|
| 8,786,310 B1* | 7/2014 | Lu et al. | 326/41 |
| 8,997,033 B1* | 3/2015 | Hew | 716/116 |
| 2007/0283311 A1* | 12/2007 | Karoubalis et al. | 716/16 |
| 2010/0283505 A1* | 11/2010 | Koch et al. | 326/41 |

OTHER PUBLICATIONS

"The Syndicated", vol. 5, Issue 2 by Synplicity @2005.*

* cited by examiner

*Primary Examiner* — Nha Nguyen
(74) *Attorney, Agent, or Firm* — LeRoy D. Maunu (57) ABSTRACT

A circuit design is created in a computer memory in response to user input to a computer processor. The circuit design has a static portion. A virtual socket is instantiated in the circuit design in response to user input, and one or more reconfigurable modules are instantiated in the virtual socket in response to user input. The static portion of the circuit design is coupled to the one or more reconfigurable modules, and configuration data are generated from the circuit design. The configuration data include a configuration bitstream corresponding to the static portion of the circuit design and one or more partial configuration bitstreams corresponding to the one or more reconfigurable modules.

20 Claims, 7 Drawing Sheets

SYSTEM AND METHOD FOR PREPARING PARTIALLY RECONFIGURABLE CIRCUIT DESIGNS

TECHNICAL FIELD

The disclosure generally relates to preparing partially reconfigurable circuit designs.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Partial reconfiguration has made it possible to reduce the power consumed and the size of circuits implemented on programmable ICs. Using partial reconfiguration, it is possible to dynamically change a portion of a circuit in response to changes in operating conditions, while keeping other portions of the circuit running. However, current design tools are limited to supporting the development of static designs, which are designs that have a fixed physical topology. For example, in a static design there is a one-to-one mapping between design elements and FPGA resources.

Developing partial reconfiguration designs using current tools is cumbersome and prone to error. To create a partial reconfiguration design, the designer creates a static design that contains instantiations of empty (black-box) modules to represent the reconfigurable regions. Each reconfigurable region corresponds to a portion of a configuration bitstream that implements the design, with that portion being filled (perhaps multiple times) at runtime using partial bitstreams for reconfigurable modules. For each reconfigurable region, the designer creates constraints that define a set of physical design resources in order to define the bounds of the reconfigurable region. Each reconfigurable module is an element that may occupy a reconfigurable region during runtime, with different reconfigurable modules occupying the reconfigurable region at different times. The designer creates and adds decoupling blocks to surround the reconfigurable regions. Each decoupling block ensures that a signal leaving (and on occasion, entering) a reconfigurable region takes on a known, safe, value during the "reconfiguration interval," which is the period of time when the reconfigurable module in a reconfigurable region is being replaced by another reconfigurable module. The designer creates a set of designs in which each design represents one reconfigurable module that can be inserted into the static portion of the design at run time. The designer must ensure that identical interfaces and names are maintained for all the reconfigurable modules targeted for a reconfigurable region. The reconfigurable modules and static portion of the design are synthesized independently, and the designer creates a set of configurations in which each configuration is a fully populated static design including the static portion and a reconfigurable module placed in each reconfigurable region. Special commands are used to link the reconfigurable modules to the appropriate reconfigurable regions in the different configurations.

SUMMARY

According to a method of preparing a partially reconfigurable circuit design, a circuit design is created in a computer memory in response to user input to a computer processor, and the circuit design has a static portion. One or more virtual sockets are instantiated in the circuit design in response to user input, and one or more reconfigurable modules are instantiated in the virtual socket(s) in response to user input. The static portion of the circuit design is coupled to the one or more reconfigurable modules, and configuration data are generated from the circuit design. The configuration data include a configuration bitstream corresponding to the static portion of the circuit design and one or more partial configuration bitstreams corresponding to the one or more reconfigurable modules.

A system includes a computer processor and a memory arrangement coupled to the computer processor. The memory arrangement is configured with instructions for preparing a partially reconfigurable circuit design. The instructions when executed by the computer processor cause the computer processor to create a circuit design in a computer memory in response to user input to a computer processor. The circuit design has a static portion. One or more virtual sockets are instantiated in the circuit design in response to user input, and one or more reconfigurable modules are instantiated in the virtual socket(s) in response to user input. The static portion of the circuit design is coupled to the one or more reconfigurable modules, and configuration data are generated from the circuit design. The configuration data include a configuration bitstream corresponding to the static portion of the circuit design and one or more partial configuration bitstreams corresponding to the one or more reconfigurable modules.

Other features will be recognized from consideration of the Detailed Description and Claims, which follow.

BRIEF DESCRIPTION OF THE DRAWINGS

Various aspects and features of the methods and systems will become apparent upon review of the following detailed description and upon reference to the drawings, in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and systems simplify the task of preparing a partially reconfigurable circuit design and reduce chances of introducing errors into the design or resulting implementation of the reconfigurable circuit design. In addition, the system-level specification of the design captures and reflects the designer's intent in having one or more reconfigurable portions, along with the reconfigurable modules that specify circuitry for those reconfigurable portions.

A circuit design tool recognizes virtual sockets, one or more of which can be instantiated in a circuit design to specify portions of the circuit that are reconfigurable. In one implementation, the design tool provides a graphical user interface that allows a designer to drag and drop a virtual socket alongside static portions of the circuit design. Reconfigurable modules can be instantiated within the virtual socket by dragging different modules from a library and dropping the modules in the virtual socket. Different instances of the same module may be reconfigurable or static. A module instantiated within a virtual socket is a reconfigurable module, but the same module instantiated outside a virtual socket would be a static module.

Decouplers may be automatically added to a virtual socket by the design tool. The decouplers disconnect the circuitry within the virtual socket from the static portions of the design while the circuitry of the virtual socket is undergoing partial reconfiguration. A decoupler is instantiated for each signal at the interface between the virtual socket and the static portions of the design, and the static portions are connected to the reconfigurable modules via the decouplers. Configuration data may then be generated from the circuit design.

Virtual sockets provide the designer with a single view of the multiple reconfigurable modules that are within each virtual socket, and the ability to manage the reconfigurable modules together. A virtual socket thereby captures design intent and may also have design-intent-specific checks. A virtual socket may also induce design-intent-specific behavior in the design tool. For example, one type of virtual socket may be used for in-field update purposes, which instructs the design tools that there can only be one reconfigurable module that is to be updated in the field. Another example is a low power virtual socket that is limited to reconfigurable modules that implement the same function but have different implementations with different power profiles. A time-multiplexed virtual socket may have different reconfigurable modules, each of which is executed for a fixed number of cycles and then replaced by another one of the reconfigurable modules for execution. A pre-fetchable virtual socket may be used to preload a reconfigurable module in order to reduce the latency involved in switching from executing one reconfigurable module to executing another reconfigurable module.

Figure 1:
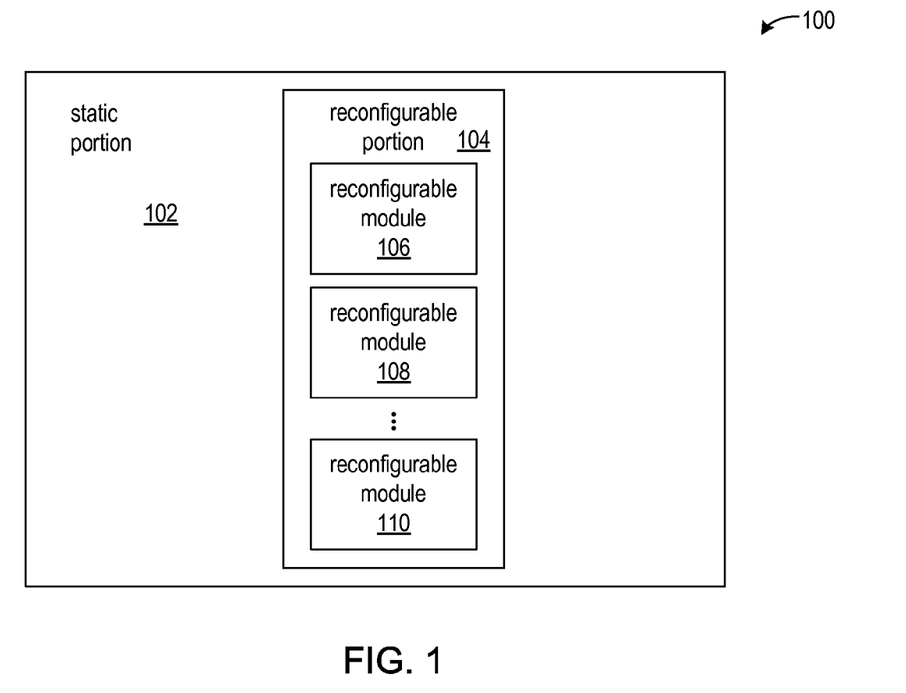
FIG. 1 is a block diagram of a circuit design having a static portion and a reconfigurable portion, in which alternative reconfigurable modules may be operated at different times with the static portion.

FIG. 1 is a block diagram of a circuit design 100 having a static portion 102 and a reconfigurable portion 104 in which alternative reconfigurable modules 106, 108, . . . 110 may be operated at different times with the static portion. In an implementation of the circuit design 100, a first set of programmable resources of a programmable IC (not shown) is assigned to implement the static portion 102 of the circuit design, and a second set of programmable resources (not shown) is assigned to implement the reconfigurable portion 104. The static portion of the circuit design also includes modules (not shown) that are interconnected. The reconfigurable modules and one or more modules of the static portions would be connected to ports for communicating. A module is recognized as a circuit design component that implements a designated function and has defined input and output interfaces for connecting to other modules.

Though all of the reconfigurable modules 106, 108, . . . 110 are shown within the reconfigurable portion 104, when the circuit design 100 is implemented and operating on a programmable IC, only one of the reconfigurable modules is operated at a time. In circuit designs in which execution of only one of the reconfigurable modules 106, 108, . . . 110 is needed at a time, circuit resources can be saved through time sharing of the programmable IC resources assigned to the reconfigurable modules. In a use case in which a reconfigurable portion of a circuit design is implemented to reduce power consumption, the reconfigurable portion may have only one reconfigurable module that performs a function and another reconfigurable module that does not perform any circuit functions. The reconfigurable module that does not perform any circuit functions may be realized as a blank partial reconfiguration bitstream that does not program the resources of the reconfigurable portion. A circuit design may have multiple reconfigurable portions rather than only one reconfigurable portion 104 as shown. Each reconfigurable portion would have a different set of reconfigurable modules.

The disclosed methods and systems provide assistance to designers for creating and maintaining circuit designs. In a single system view, a designer can specify the different reconfiguration modules to be part of the design, and the captured specification reflects the designer's intent for the circuit design to be partially reconfigurable. Decoupling logic and other interfaces needed for partial reconfiguration may be automatically added.

Figure 2:
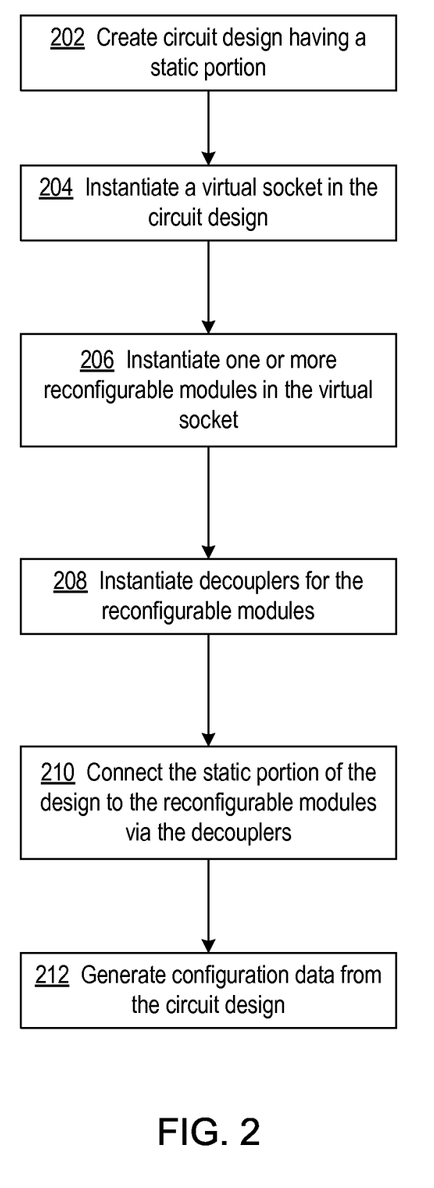
FIG. 2 is a flowchart of a process for making a circuit design having static and reconfigurable portions.

FIG. 2 is a flowchart of a process for making a circuit design having static and reconfigurable portions. The process of FIG. 2 may be implemented within a circuit design tool executing on a computer processor and at block 202 includes creating a circuit design in a computer memory in response to user input. Design entry may be provided with a block-based graphical user interface or a hardware description language, for example.

Static and reconfigurable portions of the circuit design are established in response to user input. The static portion of the circuit design includes modules of the circuit design that are not contained within a virtual socket. A reconfigurable portion of the circuit design may be established by instantiating a virtual socket in response to user input at block 204. The attributes of a virtual socket specify that the modules instantiated within the virtual socket are reconfigurable modules. At block 206, one or more reconfigurable modules are instantiated in the virtual socket in response to user input. In an example implementation, the reconfigurable modules may be dragged from a library of modules (not shown) and dropped in a block that represents the virtual socket.

At block 208 decouplers may be instantiated in the circuit design. The decouplers are circuit design components that selectively couple and decouple signals between the static portion and the reconfigurable modules. The decouplers may be used to ensure that signals output from, and in some instances input to, a reconfigurable module have safe values during a reconfiguration interval. A reconfiguration interval is the time period in which the resources of a programmable IC that are assigned to a reconfigurable portion of a circuit design undergo reconfiguration in replacing one reconfigurable module with another reconfigurable module. In an example implementation, a decoupling signal controls the decouplers. In a first state, the decoupling signal causes the decouplers to connect signals between the static portion and the reconfigurable module, and in a second state, the decoupling signal causes the decouplers to disconnect signals between the static portion to the reconfigurable module. In some circuit designs decouplers may not be needed and can be omitted from the design.

The decouplers may be automatically generated by the design tool. In one implementation, a decoupler may be instantiated in response to the designer or user drawing a connection between a port of the static portion and a port of the reconfigurable portion. In another implementation, decouplers may be instantiated in response to ports created on the virtual socket and the names of the ports on the virtual socket matching names of ports in the static portion. Alternatively, the design tool may analyze ports of the reconfigurable modules and instantiate a decoupler for each unique port. In an example implementation, the number of unique ports may be determined based on combinations of directions and protocols of the ports on the reconfigurable modules. For example, each port has attributes that include a port direction and a port protocol. For each combination of port direction and port protocol, the maximum number of ports of that combination on any one of the reconfigurable modules is the number of decouplers instantiated for that combination of port direction and port protocol. The respective numbers of ports of each unique combination are determined, and the greatest of the respective numbers is the number of decouplers that are instantiated for that combination. The numbers of decouplers for other combinations of port direction and port protocol may be similarly determined. Examples of protocols include simple protocols such as CLK, RESET, DATA, and INTERRUPT protocols, as well as complex protocols such as the AXI3, AXI4, AXI4-Lite, AXI4 Stream protocols from ARM Holdings PLC, and also HDMI, GPIO, GMII, JTAG and other protocols.

At block 210, the static portion of the circuit design is connected to the reconfigurable portion of the circuit design. In particular, ports in the static portion are connected to ports of the decouplers, and ports of the decouplers are connected to ports of the reconfigurable modules. The ports may be connected in response to the designer drawing connection lines between the ports.

At block 212, configuration data are generated from the circuit design. The configuration data include a configuration bitstream for the static portion of the circuit design and multiple partial reconfiguration bitstreams for the reconfigurable portion of the circuit design. Each of the partial reconfiguration bitstreams implements one of the reconfigurable modules and programs the resources of the programmable IC that are assigned to the reconfigurable portion of the circuit design.

Figure 3:
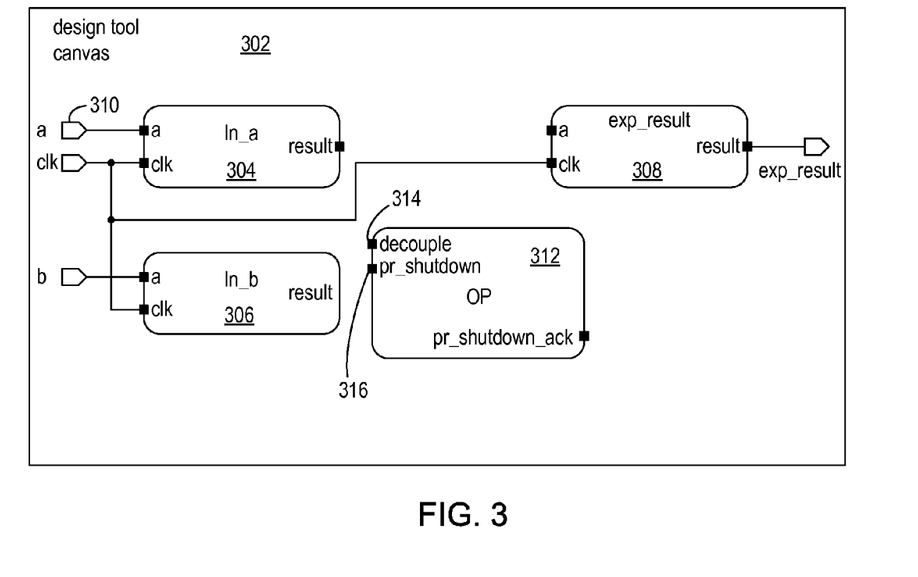
FIG. 3 shows a design tool canvas in which a virtual socket has been instantiated along with a static portion of a circuit design.

FIG. 3 shows a design tool canvas in which a virtual socket 312 has been instantiated along with a static portion of a circuit design. The design tool canvas 302 represents a portion of a work area presented on a display screen by a circuit design tool. The circuit design tool enables a designer to construct a circuit design by dragging and dropping modules on the design tool canvas and drawing connections between the modules. FIGS. 3, 4, 5, 6, and 7 illustrate an example in which a circuit design having a reconfigurable portion is created to implement the function, $e^{OP(ln\_a, ln\_b)}$, where OP is one of ADD (A, B), SUBTRACT (A, B), or ACCUMULATE (A). Because OP can be one of three different functions, OP may be implemented as a reconfigurable portion of the circuit design, with reconfigurable modules implementing the ADD, SUBTRACT, and ACCUMULATE functions.

In FIG. 3, the static portion of the circuit design includes modules 304, 306, and 308, and ports for the signals, a, b, clk, and exp_result. Modules 304 and 306 implement the natural logarithm function, ln. Module 304 computes the natural logarithm of signal a, module 306 computes the natural logarithm of signal b, and the clk signal is input to the clock ports of the modules. Module 308 computes the function $e^a$ (a is the name of the port on module 308 and should not be confused with the signal "a" at port 310).

A virtual socket 312 is instantiated for the function OP. The virtual socket may be instantiated in the circuit design in response to user selection and placement of an object in a graphical user interface, for example. The presence of the virtual socket in the circuit design not only captures and demonstrates the designer's intent to subsequent editors of the circuit design, but also makes attributes of the virtual socket available to downstream circuit processing tools, which may be beneficial in preparing a partial reconfiguration controller, simulating the circuit design, and generating configuration bitstreams.

The design tool establishes default ports on the virtual socket, including a decouple port 314 for a decoupling signal (decouple), a partial reconfiguration shutdown port 316 for a partial reconfiguration shutdown signal (pr_shutdown), and a partial reconfiguration shutdown acknowledgement port 318 for a partial reconfiguration shutdown acknowledgment signal (pr_shutdown_ack). The decoupling signal will control the decouplers that are added in subsequent figures. The pr_shutdown signal may be used to signal to a reconfigurable module that partial reconfiguration is about to commence, allowing the reconfigurable module to save state, for example. Depending on the application, the signal may or may not be used by the reconfigurable module. The design tool also establishes a default output signal on the virtual socket. The default output signal, pr_shutdown_ack, may be output by a reconfigurable module to indicate that the reconfigurable module is ready for partial reconfiguration to commence.

Figure 4:
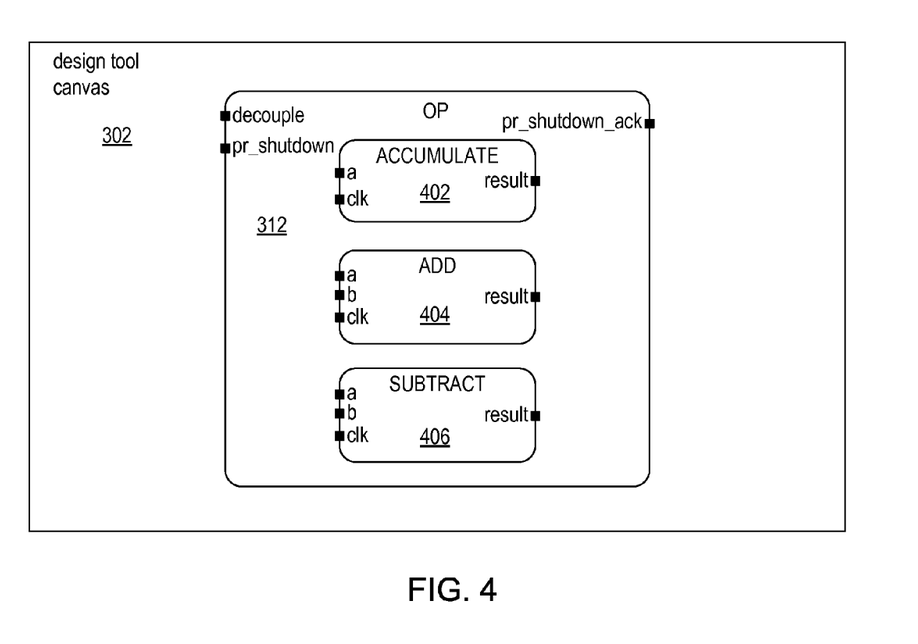
FIG. 4 shows a design tool canvas in which reconfigurable modules have been instantiated within the virtual socket.

FIG. 4 shows a design tool canvas 302 in which reconfigurable modules have been instantiated within the virtual socket 312. The reconfigurable modules, which may be added by way of a graphical user interface or by a command interface, include an ACCUMULATE module 402, an ADD module 404, and a SUBTRACT module 406. Though the example shows all the reconfigurable modules having been added to the virtual socket before proceeding to connect the reconfigurable modules to the static portion of the circuit design, one reconfigurable module may be added to the virtual socket and then connected to the static portion of the circuit design before another reconfigurable module is added.

The ACCUMULATE reconfigurable module has a different number of ports from the other reconfigurable modules. Specifically, the ACCUMULATE reconfigurable module has input ports a and clk, and the ADD and SUBTRACT reconfigurable modules both have input ports a, b, and clk. In an example implementation, the design tool is configured to generate wrappers (shown in FIG. 5, #514, 516, 518) that encapsulate the reconfigurable modules, and the design tool adds respective sets of ports to the wrappers such that each set of ports is identical to the other sets of ports.

Figure 5:
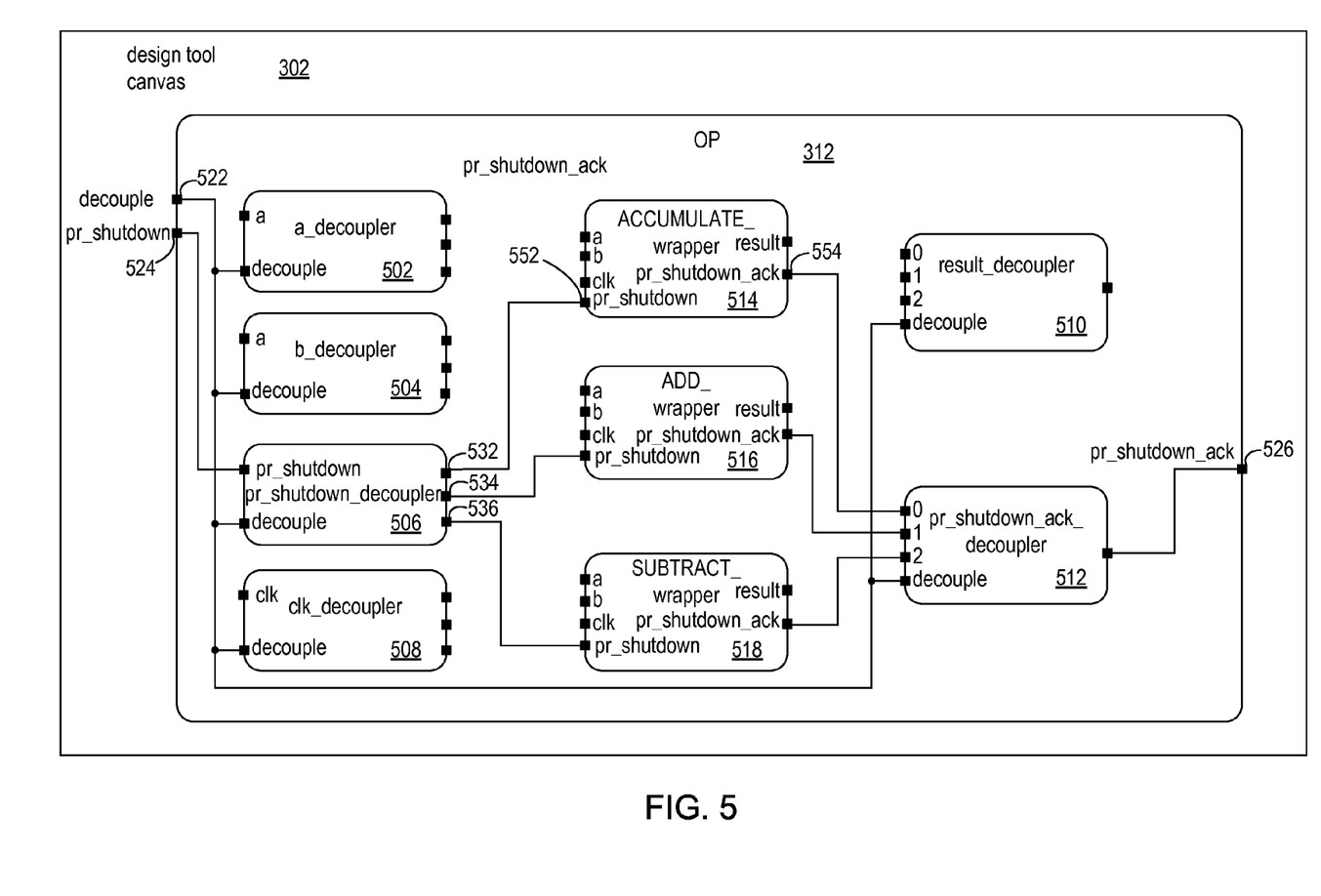
FIG. 5 shows a design tool canvas in which decouplers have been instantiated within the virtual socket.

FIG. 5 shows a design tool canvas 302 in which decouplers have been instantiated within the virtual socket 312. Note that the reconfigurable modules 402, 404, and 406 of FIG. 4 are encapsulated in wrappers 514, 516, and 518, respectively, and the input and output interfaces of the wrappers are the same. Default ports 552 and 554 are added to each wrapper for pr_shutdown and pr_shutdown_ack signals, respectively. In addition, application ports, for example, a, b, clk, and result are also added to the wrappers. The application ports on each wrapper are a superset ({a, b, clk, result}) of the different sets of application ports on the reconfigurable modules that are wrapped (the ACCUMULATE reconfigurable module 402 has application ports {a, clk, and result}; the ADD reconfigurable module 404 has application ports {a, b, clk, result}, and the SUBTRACT reconfigurable module 406 has application ports {a, b, clk, result}).

The decouplers 502, 504, 506, 508, 510, and 512 may be instantiated as described above in the description of FIG. 2, but in the example of FIG. 5 the decouplers are instantiated by the design tool according to the number of unique ports on the wrapped reconfiguration modules. For each combination of port direction and port protocol, the number of ports of that combination on any one of the wrapped reconfigurable modules is the number of decouplers instantiated for that combination of port direction and port protocol. The number of ports of that combination on any one of the wrapped reconfigurable modules may be used, because the wrappers have been assigned identical sets of ports as explained above. For example, the protocol of the a and b ports on the wrappers 514, 516, and 518 is the same, and the direction of the a and b ports is the same. Thus, one combination of port protocol and port direction covers the a and b ports on the wrappers 514, 516, and 518. The number of ports of this combination on any one of the wrappers is two; all the wrappers have two such ports. The two decouplers instantiated for the combination are decoupler 502 and 504. The decouplers for the pr_shutdown, clk, result, and pr_shutdown_ack ports may be similarly instantiated.

Each of the decouplers is configured and arranged to selectively couple and decouple a signal between the static portion and the reconfigurable portion in response to the decouple signal at decouple port 522 on the virtual socket. The connections between the default ports 522, 524, and 526 on the virtual socket and the corresponding ports on the decouplers may be automatically established by the design tool. In addition, the connections between the output ports of the pr_shutdown_decoupler 506 and the wrappers 514, 516, and 518, and the connections between the pr_shutdown_ack ports of the wrappers and the input ports of the pr_shutdown_ack_decoupler 512 may be automatically established by the design tool.

The pr_shutdown_decoupler 506 is shown as having individual output ports 532, 534, and 536 that are connected to the pr_shutdown input ports on the wrappers 514, 516, and 518, respectively, rather than a single output port connected to the input ports on the three wrappers. The individual output ports may be useful for simulators that may require a unique connection for each reconfigurable module. The individual output ports may also be useful where fanout is not appropriate, such as in bidirectional interfaces.

Figure 6:
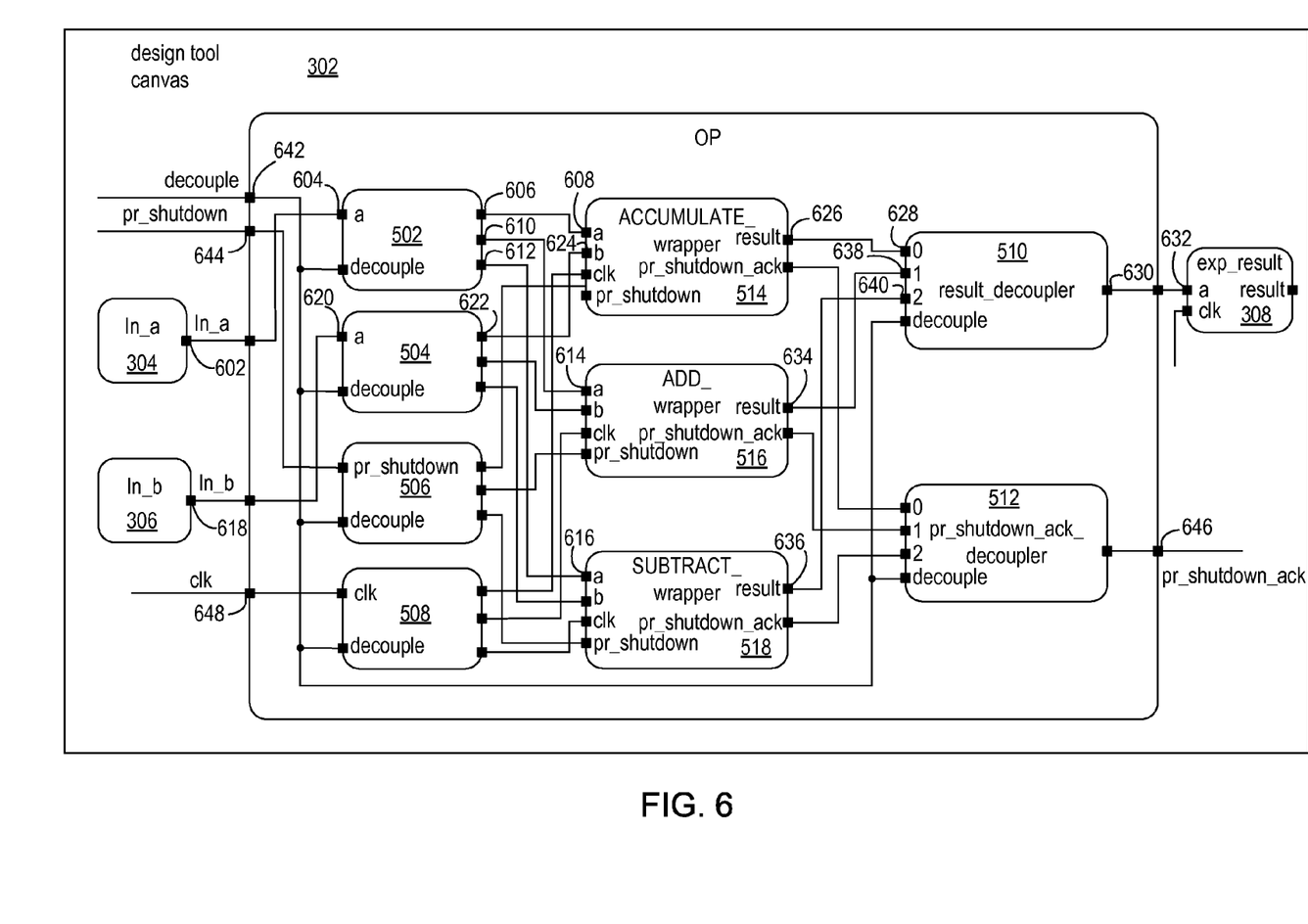
FIG. 6 shows a design tool canvas in which the static portion of the circuit design has been connected to the reconfigurable modules via the decouplers.

FIG. 6 shows a design tool canvas 302 in which the static portion of the circuit design has been connected to the reconfigurable modules via the decouplers. The connections may be made in response to user-specified connections between the ports in the static portion and ports on the decouplers. For example, the designer may draw a connection between port 602 on the ln_a module 304 and port 604 on the decoupler 502. The designer may further connect output port 606 on decoupler 502 to input port 608 on the ACCUMULATE_wrapper 514, output port 610 on decoupler 502 to input port 614 on the ADD_wrapper 516, and output port 612 on decoupler 502 to input port 616 on the SUBTRACT_wrapper 518. The designer may further draw a connection from output port 618 on the ln_b module 306 to input port 620 on the decoupler 504, and from output port 622 of the decoupler 504 to the input port 624 of the ACCUMULATE_wrapper 514.

The designer may connect the result port 626 of the ACCUMULATE_wrapper 514 to the input port 628 of the result_decoupler 510, and the output port 630 of the result_decoupler 510 to the input port 632 of the exp_result module 308 in the static portion of the circuit design. The design tool may automatically connect the result ports 634 and 636 of the ADD_wrapper 516 and the SUBTRACT_wrapper 518 to the input ports 638 and 640 of the result_decoupler 510 since the ports 638 and 640 are the only ports compatible for connecting to ports 634 and 636.

The designer may also make connections from the static portion to the decouple port 642, pr_shutdown port 644, pr_shutdown_ack port 646, and clk port 648, as well as connections between the decouplers 508, 510, and 512 and the wrappers 514, 516, and 518, as may be necessary.

Figure 7:
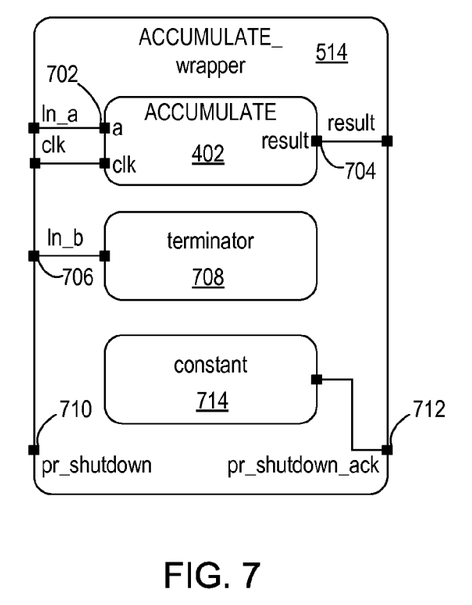
FIG. 7 shows an example of a wrapper that has been built around a reconfigurable module.

FIG. 7 shows an example of a wrapper that has been built around a reconfigurable module. The wrapper assists in maintaining consistent interfaces across the different reconfigurable modules and providing default values for default signals.

The example includes the ACCUMULATE_wrapper 514, which is generated to encapsulate the ACCUMULATE reconfigurable module 402. The ACCUMULATE reconfigurable module accumulates the values that appear on input port 702 and outputs result values on result port 704. The design tool may automatically add input port 706 and terminator 708 to the wrapper in order to make the input ports of the ACCUMULATE_wrapper consistent with the input ports of the ADD_wrapper and SUBTRACT_wrapper (FIG. 5). The input port 706 and terminator 708 may be automatically added by the design tool during a compilation stage in the generation of the configuration data for the circuit design (FIG. 7, block 212). The additional input port 706 is needed on the ACCUMULATE_wrapper because the ADD and SUBTRACT reconfigurable modules have input ports for two operands, but the ACCUMULATE reconfigurable module has a port for only one operand. The design tool inserts the terminator 708 so that when the partial reconfiguration bitstream for the ACCUMULATE_wrapper is loaded at runtime, the signal at port 706 is properly managed. The terminator 708 is provided to ensure that any outputs on the interface port 706 are driven to safe values. Note that because the pr_shutdown port 710 carries only an input signal, no terminator is added. A terminator may be used to protect a port, because some tools automatically remove unconnected ports and signals during optimization. Since the designer may not need to know that port 706 and terminator 708 have been added, the ports may be added during a compilation stage and not displayed to the designer when static portion of the circuit design is connected to the reconfigurable portion of the circuit design. In another implementation, the designer may control whether or not added ports and terminators are displayed.

The pr_shutdown port 710 and pr_shutdown_ack port 712 are provided on the ACCUMULATE_wrapper by the design tool. The pr_shutdown port 710 may be connected to a pr_shutdown signal to indicate to the reconfigurable module that the reconfigurable module is going to be removed from the programmable IC. The pr_shutdown signal allows the reconfigurable module to perform any needed actions, such as saving state, before it is removed from the programmable IC. The reconfigurable module may indicate that it is ready to be removed with a pr_shutdown_ack signal at port 712.

In the example ACCUMULATE_wrapper 514, the ACCUMULATE reconfigurable module does not use the pr_shutdown signal. Thus, the pr_shutdown port 710 is not connected to any logic in the wrapper. Because the ACCUMULATE reconfigurable module does not use the pr_shutdown signal, a constant circuit 714 is added to the wrapper 514 by the design tool and connected to the pr_shutdown_ack port 712. The constant circuit provides a signal that indicates that the ACCUMULATE_wrapper can be safely removed from the programmable IC. For a reconfigurable module that requires notification of partial reconfiguration, the constant circuit 714 may be replaced with a circuit that is connected to the ports 710 and 712 for responding to the pr_shutdown signal and indicating reconfiguration can commence.

Figure 8:
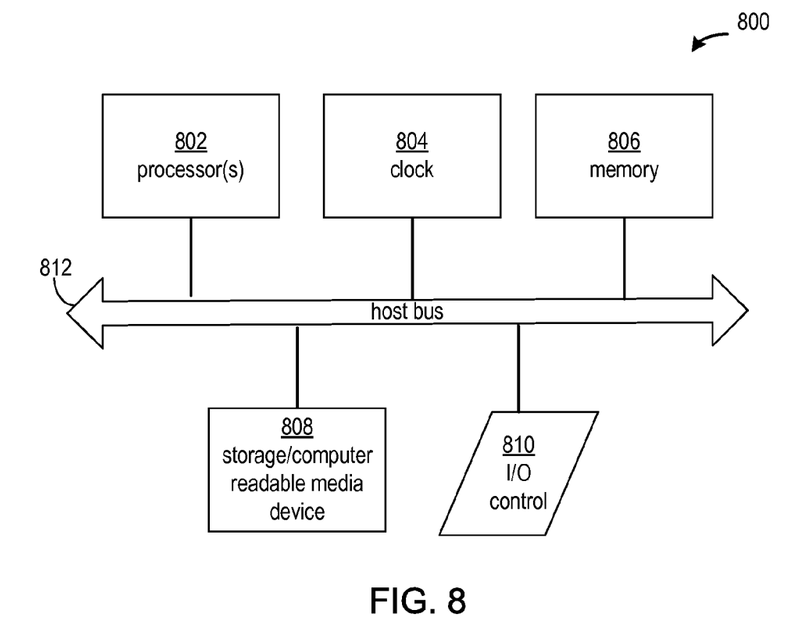
FIG. 8 shows an example of a computing arrangement on which the processes and data structures described herein may be implemented.

FIG. 8 shows an example of a computing arrangement on which the processes and data structures described herein may be implemented. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 800 includes one or more processors 802, a clock signal generator 804, a memory arrangement 806, a storage arrangement 808, and an input/output control unit 810, all coupled to a host bus 812. The arrangement 800 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 802 may be one or more general purpose processors, or a combination of one or more general purpose processors and suitable co-processors, or one or more specialized processors (e.g., RISC, CISC, pipelined, etc.).

The memory arrangement 806 typically includes multiple levels of cache memory, and a main memory. The storage arrangement 808 may include local and/or remote persistent storage, such as provided by magnetic disks (not shown), flash, EPROM, or other non-volatile data storage. The storage unit may be read or read/write capable. Further, the memory arrangement 806 and storage arrangement 808 may be combined in a single arrangement.

The processor(s) 802 executes the software in storage arrangement 808 and/or memory arrangement 806, reads data from and stores data to the storage arrangement 808 and/or memory arrangement 806, and communicates with external devices through the input/output control arrangement 810. These functions are synchronized by the clock signal generator 804. The resource of the computing arrangement may be managed by either an operating system (not shown), or a hardware control unit (not shown).

Figure 9:
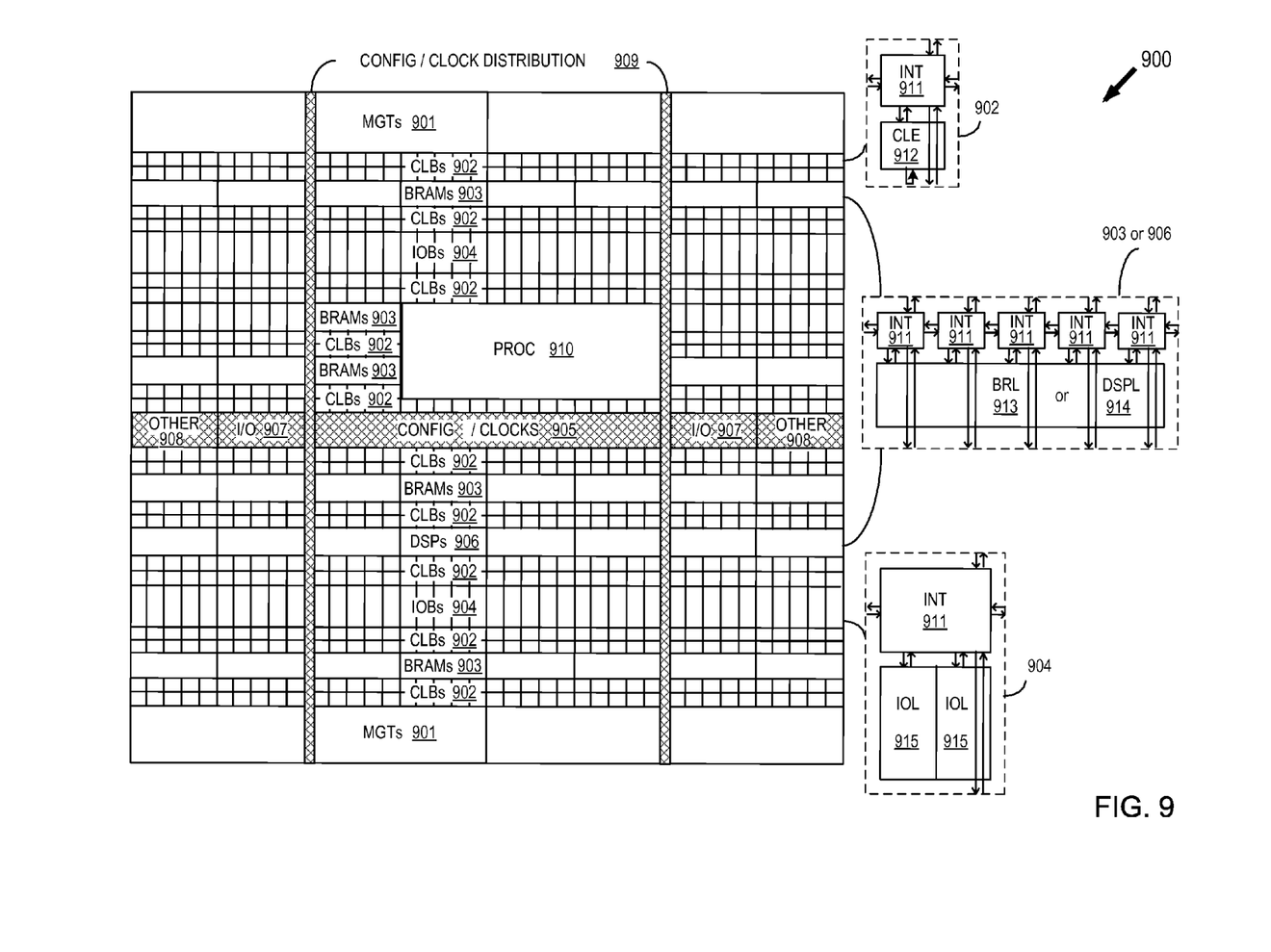
FIG. 9 shows an example of a programmable IC to which a circuit design having static and reconfigurable portions may be targeted for implementation.

FIG. 9 shows an example of a programmable IC to which a circuit design having static and reconfigurable portions may be targeted for implementation. The programmable IC may also be referred to as a System On Chip (SOC) that includes field programmable gate array logic (FPGA) along with other programmable resources. FPGA logic may include several different types of programmable logic blocks in the array. For example, FIG. 9 illustrates programmable IC 900 that includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907, for example, clock ports, and other programmable logic 908 such as digital clock managers, analog-to-digital converters, system monitoring logic, and so forth. Some programmable ICs having FPGA logic also include dedicated processor blocks (PROC) 910 and internal and external reconfiguration ports (not shown).

In some FPGA logic, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA logic. The programmable interconnect element INT 911 also includes the connections to and from the programmable logic element within the same tile, as shown by the examples included at the top of FIG. 9.

For example, a CLB 902 can include a configurable logic element CLE 912 that can be programmed to implement user logic, plus a single programmable interconnect element INT 911. A BRAM 903 can include a BRAM logic element (BRL) 913 in addition to one or more programmable interconnect elements. Typically, the number of interconnect elements included in a tile depends on the height of the tile. A BRAM tile may have the same height as five CLBs, but other numbers (e.g., four) can also be used. A DSP tile 906 can include a DSP logic element (DSPL) 914 in addition to an appropriate number of programmable interconnect elements. An IOB 904 can include, for example, two instances of an input/output logic element (IOL) 915 in addition to one instance of the programmable interconnect element INT 911. As will be clear to those of skill in the art, the actual I/O bond pads connected, for example, to the I/O logic element 915, are manufactured using metal layered above the various illustrated logic blocks, and typically are not confined to the area of the input/output logic element 915.

A columnar area near the center of the die (shown shaded in FIG. 9) is used for configuration, clock, and other control logic. Horizontal areas 909 extending from this column are used to distribute the clocks and configuration signals across the breadth of the programmable IC.

Some programmable ICs utilizing the architecture illustrated in FIG. 9 include additional logic blocks that disrupt the regular columnar structure making up a large part of the programmable IC. The additional logic blocks can be programmable blocks and/or dedicated logic. For example, the processor block PROC 910 shown in FIG. 9 spans several columns of CLBs and BRAMs.

Note that FIG. 9 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure, even though the combination is not explicitly shown or explicitly described as a combination.

The methods and system are thought to be applicable to a variety of systems for preparing partially reconfigurable circuit designs. Other aspects and features will be apparent to those skilled in the art from consideration of the specification. It is intended that the specification and drawings be considered as examples only, with a true scope of the invention being indicated by the following claims.

What is claimed is:

1. A method of preparing a partially reconfigurable circuit design, comprising:
   creating, by a computer processor, a circuit design in a computer memory in response to user input to the computer processor, the circuit design having a static portion;
   instantiating a virtual socket in the circuit design in response to user input;
   instantiating decouplers in the virtual socket for the reconfigurable modules;
   instantiating one or more reconfigurable modules in the virtual socket in response to user input;
   coupling one or more modules of the static portion to the one or more reconfigurable modules via the decouplers; and
   generating configuration data from the circuit design, the configuration data including a configuration bitstream corresponding to the static portion of the circuit design and one or more partial configuration bitstreams corresponding to the one or more reconfigurable modules.

2. The method of claim 1, wherein the virtual socket includes:
   a default first port for a decoupling signal;
   a default second port for a partial reconfiguration shutdown signal; and
   a default third port for a partial reconfiguration shutdown acknowledgement signal.

3. The method of claim 2, further comprising:
   encapsulating each of the one or more reconfigurable modules in a respective wrapper; and
   adding a default fourth port for a partial reconfiguration shutdown signal, and a default fifth port for a partial reconfiguration shutdown acknowledgement signal, to each respective wrapper.

4. The method of claim 3, wherein:
   the one or more reconfigurable modules include at least two reconfigurable modules;
   the at least two reconfigurable modules include different sets of one or more application ports; and
   the method further comprises adding a superset of the different sets of application ports to each respective wrapper, respectively.

5. The method of claim 4,
   wherein each of the decouplers is configured and arranged to selectively couple and decouple a signal between the static portion and the one or more reconfigurable modules in response to the decoupling signal.

6. The method of claim 5, wherein the instantiating of the decouplers in the virtual socket includes instantiating a decoupler in response to a user-drawn connection between an interface of the static portion and an interface of the respective wrapper of one of the one or more reconfigurable modules.

7. The method of claim 5, wherein the instantiating of the decouplers in the virtual socket includes instantiating a decoupler in response to a port name on the virtual socket matching a name of a port on a wrapper.

8. The method of claim 5, wherein:
   the one or more reconfigurable modules include a plurality of reconfigurable modules;
   each default fourth port and default fifth port and application ports on each respective wrapper has a port direction and a port protocol; and
   the instantiating of the decouplers in the virtual socket includes:
      determining, for each unique combination of port direction and port protocol of the default fourth port, default fifth port, and application ports, respective numbers of ports of the unique combination on respective wrappers of the plurality of reconfigurable modules;
      determining, for each unique combination, a greatest respective number of the respective numbers of ports of the unique combination; and
      instantiating, for each unique combination of port direction and port protocol, a number of decouplers equal to the greatest respective number.

9. The method of claim 5, further comprising connecting one of the decouplers to the respective wrapper of one of the one or more reconfigurable modules in response to a user-specified connection.

10. The method of claim 1, wherein the instantiating the virtual socket in the circuit design is in response to user selection and placement of an object in a graphical user interface.

11. A system, comprising:
    a computer processor; and
    a memory arrangement coupled to the computer processor, wherein the memory arrangement is configured with instructions for preparing a partially reconfigurable circuit design, and the instructions when executed by the computer processor cause the computer processor to perform operations including:
       creating a circuit design in the memory arrangement in response to user input to the computer processor, the circuit design having a static portion;
       instantiating a virtual socket in the circuit design in response to user input;
       instantiating decouplers in the virtual socket for the reconfigurable modules;
       instantiating one or more reconfigurable modules in the virtual socket in response to user input;

coupling one or more modules of the static portion to the one or more reconfigurable modules via the decouplers; and generating configuration data from the circuit design, the configuration data including a configuration bitstream corresponding to the static portion of the circuit design and one or more partial configuration bitstreams corresponding to the one or more reconfigurable modules.

12. The system of claim 11, wherein the virtual socket includes:

a default first port for a decoupling signal;

a default second port for a partial reconfiguration shutdown signal; and a default third port for a partial reconfiguration shutdown acknowledgement signal.

13. The system of claim 12, wherein the instructions further include instructions that when executed by the computer processor cause the computer processor to perform operations including:

encapsulating each of the one or more reconfigurable modules in a respective wrapper; and adding a default fourth port for a partial reconfiguration shutdown signal, and a default fifth port for a partial reconfiguration shutdown acknowledgement signal, to each respective wrapper.

14. The system of claim 13, wherein:

the one or more reconfigurable modules include at least two reconfigurable modules;

the at least two reconfigurable modules include different sets of one or more application ports; and the instructions further include instructions that when executed by the computer processor cause the computer processor to perform operations including adding a superset of the different sets of application ports to each respective wrapper, respectively.

15. The system of claim 14, wherein each of the decouplers is configured and arranged to selectively couple and decouple a signal between the static portion and the one or more reconfigurable modules in response to the decoupling signal.

16. The system of claim 15, wherein the instantiating of the decouplers in the virtual socket includes instantiating a decoupler in response to a user-drawn connection between an interface of the static portion and an interface of the respective wrapper of one of the one or more reconfigurable modules.

17. The system of claim 15, wherein the instantiating of the decouplers in the virtual socket includes instantiating a decoupler in response to a port name on the virtual socket matching a name of a port on a wrapper.

18. The system of claim 15, wherein:

the one or more reconfigurable modules include a plurality of reconfigurable modules;

each default fourth port and default fifth port and application ports on each respective wrapper has a port direction and a port protocol; and the instantiating of the decouplers in the virtual socket includes:

determining, for each unique combination of port direction and port protocol of the default fourth port, default fifth port, and application ports, respective numbers of ports of the unique combination on respective wrappers of the plurality of reconfigurable modules;

determining, for each unique combination, a greatest respective number of the respective numbers of ports of the unique combination; and instantiating, for each unique combination of port direction and port protocol, a number of decouplers equal to the greatest respective number.

19. The system of claim 15, wherein the instructions further include instructions that when executed by the computer processor cause the computer processor to perform operations including:

connecting one of the decouplers to the respective wrapper of one of the one or more reconfigurable modules in response to a user-specified connection.

20. The system of claim 11, wherein the instantiating the virtual socket in the circuit design is in response to user selection and placement of an object in a graphical user interface.

* * * * *